United States Patent [19]
Kim et al.

[11] Patent Number: 5,124,585
[45] Date of Patent: Jun. 23, 1992

[54] PULSED BOOTSTRAPPING OUTPUT BUFFER AND ASSOCIATED METHOD

[76] Inventors: Jun Kim, 1674 Washington St., San Mateo, Calif. 94403; In-Nan Wu, 691 Sheraton Dr., Sunnyvale, Calif. 94087

[21] Appl. No.: 642,077

[22] Filed: Jan. 16, 1991

[51] Int. Cl.$^5$ .................. H03K 19/12; H03K 19/96
[52] U.S. Cl. .................. 307/482; 307/475; 307/451
[58] Field of Search ............ 307/482, 451, 475, 465, 307/468

[56] References Cited

U.S. PATENT DOCUMENTS

| | | | |
|---|---|---|---|
| 4,395,644 | 7/1983 | Misaizu | 307/482 |
| 4,508,978 | 4/1985 | Reddy | 307/482 |
| 4,611,134 | 9/1986 | Ando | 307/482 |
| 4,617,476 | 10/1986 | Dalrymple | 307/482 |
| 4,633,105 | 12/1986 | Tsujimoto | 307/482 |
| 4,914,323 | 4/1990 | Shibata | 307/482 |

FOREIGN PATENT DOCUMENTS 63-257325 10/1988 Japan .................. 307/482

Primary Examiner—Eugene R. LaRoche
Assistant Examiner—Tan Dinh
Attorney, Agent, or Firm—Flehr, Hohbach, Test, Albritton & Herbert

[57] ABSTRACT

An output buffer circuit is provided for use with a first external voltage which provides voltage at a first level, the output buffer circuit comprising: an output terminal; a second voltage supply for providing voltage at a second level less than the first level; an n-channel pull-up transistor including a drain coupled to the first voltage supply and including a source coupled to the output terminal; a p-channel pull-up transistor including a drain coupled to the output terminal and a source coupled to the second voltage supply; an n-channel pull-down transistor including a drain coupled to the output terminal; a bootstrapping turn-on circuit for raising a gate of the n-channel pull-up transistor to a raised voltage level which is above the first voltage level such that the n-channel pull-up transistor becomes turned on; a turn-off circuit for turning off the n-channel pull-up transistor when the output terminal has been substantially pulled up to the second voltage level; and a turn-on circuit for turning on the p-channel pull-up transistor when the output voltage at the output terminal has been substantially pulled up to the second level.

30 Claims, 3 Drawing Sheets

PULSED BOOTSTRAPPING OUTPUT BUFFER AND ASSOCIATED METHOD

BACKGROUND OF THE INVENTION

1. Field of the Invention

The invention relates generally to output buffers and more particularly to output buffers incorporating a pull-up transistor and a pull-down transistor.

2. Description of the Related Art

The use of an output buffer circuit which employs a pull-up transistor and a pull-down transistor is well known. In particular, the use of a CMOS output buffer circuit which includes a p-channel pull-up transistor and an n-channel pull-down transistor is well known. During low to high output signal transitions, the p-channel transistor pulls up the voltage provided at an output terminal while the n-channel transistor is cutoff. During high to low transitions, the n-channel transistor pulls down the voltage level at the output terminal while the p-channel transistor is cutoff.

In certain applications, the voltage swing provided at an output terminal may be greater than the voltage swing required to drive external circuitry coupled to the output terminal. More particularly, for example, a typical external voltage supply in CMOS circuits is 5 volts, and a typical voltage swing at the output terminal is approximately 5 volts, between 0 volts and 5 volts. In TTL logic, however, a typical voltage swing is approximately 3.3 volts, between 0 volts and 3.3 volts. Consequently, it often is not necessary to use the typical full CMOS voltage swing to drive circuitry from another logic family such as the TTL family.

Generally, more time is required to achieve a full voltage swing than is required to achieve less than a full voltage swing. Thus, transitions of an output signal between high and low voltage states can be slowed by undertaking a full logic swing when less than a full logic swing will suffice.

One way to reduce the voltage swing where less than a full swing is required to drive the external circuitry is to couple the p-channel pull-up transistor to a lower level voltage supply so that the p-channel device pulls the output terminal up to a voltage level which is less than the voltage level provided by a typical external power supply. For example, for a CMOS output buffer circuit driving a typical TTL load, a lower level power supply of approximately 3.3 volts ordinarily would be sufficient.

One possible approach to implementing such a lower level power supply is to provide it externally. Unfortunately, the use of an extra external power supply can be unduly burdensome.

Another possible approach to implementing such a lower level power supply is to integrate it into the same chip as the output buffer. This can be a problematic solution as well. More specifically, for example, an output buffer circuit may be called upon to drive a relatively large capacitive load. Unfortunately, it can be quite difficult to construct an on-chip lower level voltage supply that has a sufficiently low output impedance to drive such a large capacitive load.

Therefore, there has been a need for a CMOS output buffer circuit in which the voltage swing at the output terminal can be less than the full voltage swing permitted by typical external voltage supplies. Moreover, there has been a need for such an output buffer circuit which can be economically constructed and which is capable of driving relatively large capacitive loads. The present invention meets these needs.

SUMMARY OF THE INVENTION

The present invention provides a novel output buffer circuit. The output buffer circuit includes both a first n-channel pull-up transistor and a second pull-up transistor as well as an n-channel pull-down transistor. The output buffer also includes a bootstrapping circuit for raising the voltage level applied to the gate of the first n-channel pull-up transistor during low to high voltage transitions to a level above a first voltage level produced by an external voltage supply. A turn-off circuit discharges the voltage at the gate of the first n-channel pull-up transistor to a ground potential once the voltage at an output terminal of the buffer circuit has substantially reached a prescribed voltage level intermediate between an external voltage supply level and ground potential. Another turn-on circuit turns on the second pull-up transistor after the voltage level at the output terminal has been substantially pulled up to the prescribed intermediate voltage level. The second pull-up transistor is coupled to a voltage supply at the prescribed intermediate level.

Therefore, the buffer circuit of the present invention permits the use of an on-chip lower level voltage supply without requiring that voltage supply to drive a highly capacitive external load.

BRIEF DESCRIPTION OF THE DRAWINGS

The purpose and advantages of the present invention will be apparent to those skilled in the art from the following detailed description in conjunction with the appended drawings in which.

These and other features and advantages of the present invention will become apparent from the following description of an exemplary embodiment thereof as illustrated in the accompanying drawings.

DETAILED DESCRIPTION OF THE PREFERRED EMBODIMENT

The present invention comprises a novel output buffer circuit and an associated method. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
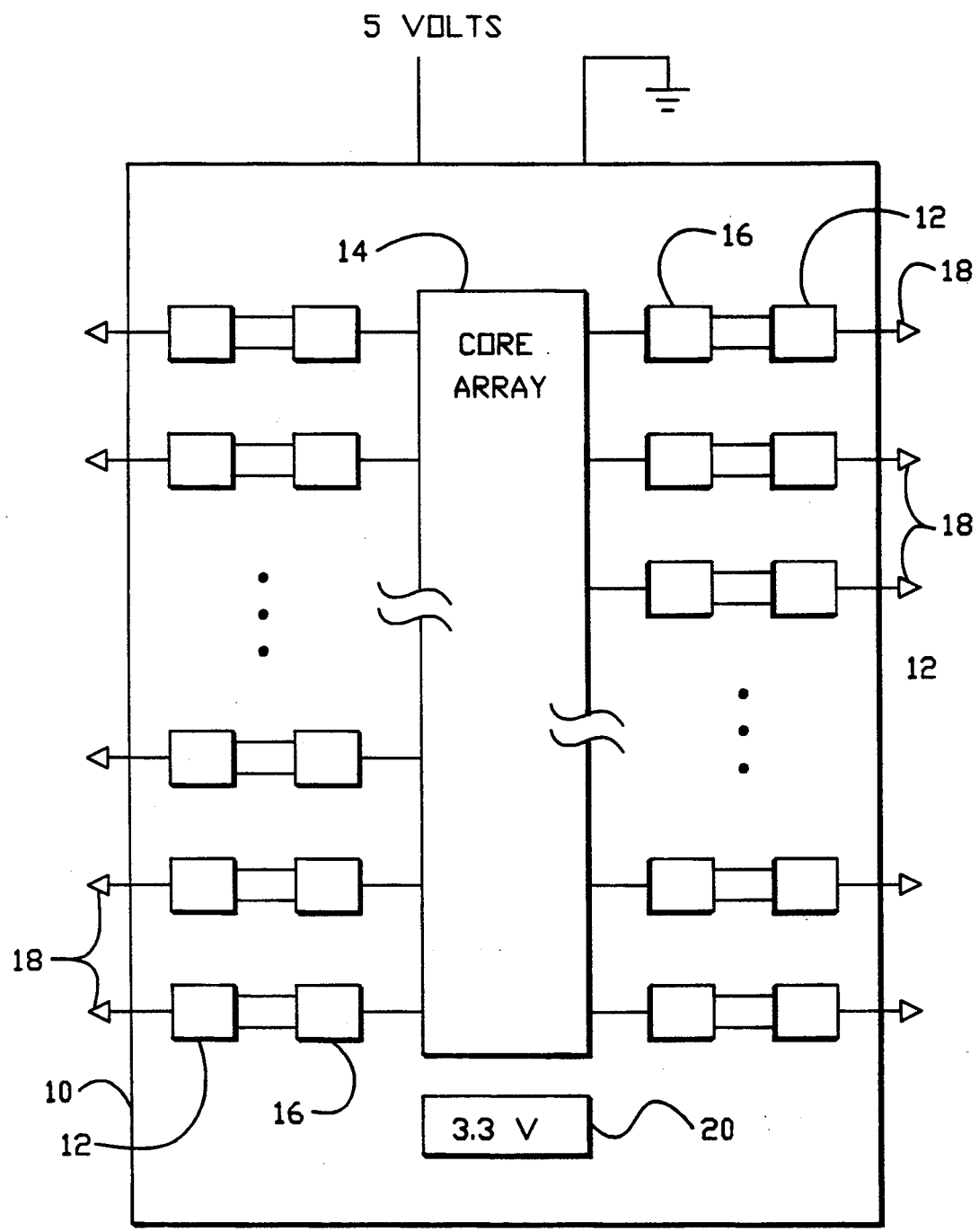
FIG. 1 is a generalized block diagram showing a typical integrated circuit memory device incorporating a plurality of output buffer circuits in accordance with the present invention.

FIG. 1 is a block diagram of an integrated circuit memory device 10, such as an SRAM or a DRAM, which is coupled to an external 5 volt supply. In accordance with the present invention, the device 10 incorporates a plurality of output buffer circuits 12 and an on-chip 3.3 volt lower level voltage supply. A core memory array 14 stores digital information in individual memory cells (not shown). Each output buffer circuit 12 is coupled to a respective sense amplifier circuit 16. During a read of digital information from an addressed memory cell in the core memory 14, a respective sense amplifier coupled to the addressed cell senses the logical state of the stored information and provides an indication of that logical state to a corresponding output buffer circuit 12. Essentially, the sense amplifier circuit 16 provides an internal output signal to the output buffer circuit 12. The output buffer circuit, in turn, provides an output signal on a respective output terminal 18.

Figure 2:
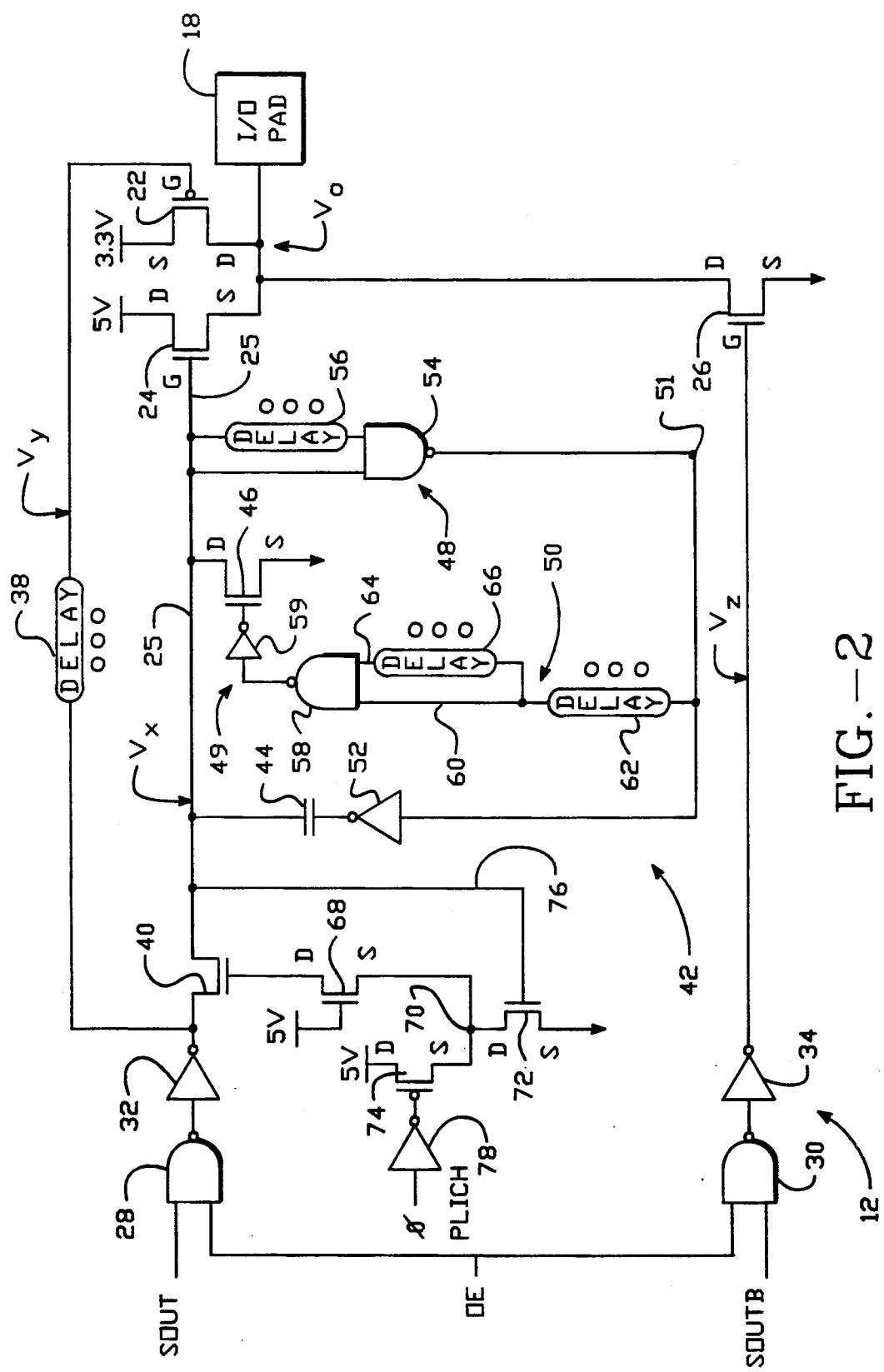
FIG. 2 is a schematic diagram of an output buffer circuit in accordance with a present embodiment of the invention.

Referring to the illustrative schematic diagram of FIG. 2, there are shown details of a representative output buffer circuit 12 from the memory device 10. The circuit 12 includes a first n-channel pull-up transistor 24 coupled to the 5 volt external voltage supply and a second p-channel pull-up transistor 22 coupled to the on-chip 3.3 volt lower level voltage supply. The first n-channel pull-up transistor 24 is used to pull up the voltage at the output terminal 18 during low to high output voltage transitions, and the second p-channel pull-up transistor 22 is used to sustain the high output voltage after pull up. Since the second p-channel transistor 22 is coupled to the lower level 3.3 volt supply, the voltage swing at the output terminal 18 can be made to be less than the full five volt swing that the 5 volt external voltage could supply. Moreover, since the second p-channel device 22 does not turn on during the low to high output voltage transition, the 3.3 volt supply 20 does not actually drive a large external capacitive load (not shown). Rather, the lower level supply 20 merely sustains the 3.3 volt output voltage level after the transition is substantially complete. A bootstrapping circuit 42 provides extra drive to the gate of the first n-channel pull-up transistor 24 to achieve rapid output voltage pull up. A turn-off circuit 49 discharges the voltage at that gate to a ground potential when the output voltage has reached approximately 3.3 volts and the p-channel transistor is turning on.

More specifically, the second p-channel pull-up transistor 22 includes a drain coupled to the output terminal 18 and a source coupled to the on-chip 3.3 volt supply 20. The first n-channel pull-up transistor 24 includes a drain coupled to the external 5 volt supply, and includes a source coupled to the output terminal 18. An n-channel pull-down transistor 26 includes a drain coupled to the output terminal 18 and a source coupled to a ground potential, typically 0 volts.

A sense amplifier (not shown), which forms no part of the present invention, provides an internal output signal (SOUT) to NAND gate 28 and provides an inverted internal output signal (SOUTB) to NAND gate 30. The NAND gates 28, 30 also receive output enable (OE) control signals. The outputs of the NAND gates 28, 30 are respectively provided to inverters 32, 34. The respective SOUT and SOUTB signals can swing between the ground potential of 0 volts and the external supply of 5 volts.

An output of inverter 32 is coupled, via inverting delay circuit 38, to a gate of the second p-channel pull-up transistor 22. The output of inverter 32 also is coupled, via pass gate 40, to a gate 25 of the first n-channel pull-up transistor 24. The output of inverter 34 is coupled to the gate of the n-channel pull-down transistor 26.

The bootstrapping circuit, indicated generally by reference numeral 42, is coupled to the gate 25 of the first n-channel pull-up transistor 24. The bootstrapping circuit 42 includes a capacitor 44 which, as explained below, is used to charge the gate 25 of transistor 24 to a voltage level of approximately 7.5 volts which is greater than the 5 volt external voltage supply level. That is, the capacitor 44 is used to bootstrap the gate 25 of transistor 24 to a voltage greater than the external 5 volt supply voltage provided to its drain. When the capacitor 44 becomes charged, n-channel pull-up transistor 24 turns on. The voltage at gate 25 is raised from 0 volts to 5, volts, which causes transistor 24 to turn on. The voltage of gate 25 then is bootstrapped to approximately 7.5 volts to raise the driveability of transistor 24. It will be appreciated that in order to avoid current spikes through transistor 24, gate 25 is not immediately bootstrapped. Rather, it is bootstrapped after transistor 24 turns on. Such current spikes could cause noise on the $V_{cc}$ power lines.

A turn-off circuit also is coupled to the gate 25 of transistor 24. The turn-off circuit 49 includes an n-channel turn-off transistor 46 with a drain coupled to the gate 25 of transistor 24 and a source coupled to the ground potential. When transistor 46 turns on, the n-channel pull-up transistor turns off.

The bootstrapping circuit capacitor 44 and the turn-off circuit and turn-off transistor 46 are coupled as shown to first and second timing and control circuits 48, 50. The capacitor 44 also is connected to an output terminal of an inverter 52.

The first timing and control circuit 48 includes a NAND gate 54 which has one input coupled directly to the gate 25 of transistor 24 and which has another input coupled through inverting delay element 56 to the gate 25. The output of the first timing and control circuit 48 is coupled to an input of the second timing and control circuit 50 and to an input of the inverter 52.

The second timing and control circuit 50 includes a NAND gate 58 which has a first input terminal 60 coupled through inverting delay circuit 62 to the output of NAND gate 54. The NAND gate 58 includes another input terminal 64 coupled through both the delay circuit 62 and a delay circuit 66 to the output of NAND gate 54. The output of NAND gate 58 is coupled to inverter 59 which, in turn, is coupled to a gate of the turn-off transistor 46.

In operation, inverting delay circuit 56 determines the duration of the bootstrapping pulse, i.e., how long node 51 stays low. The duration of the bootstrapping pulse should be sufficiently long to drive the output terminal 18 to 3.3 volts. Delay circuit 62 determines how long to delay before turning on transistor 46. The delay imposed by delay circuit 62 starts when node 51 goes low. Delay circuit 66 determines how long transistor 46 is to remain turned on. Thus, there is a pulse applied to the gate terminal of transistor 46, and transistor 46 is turned off again by the time a next output signal transition occurs.

In the presently preferred embodiment, the inverting delay circuits 38, 56, 62 and 66 are implemented using CMOS inverter circuits. An odd number of inverters are employed to achieve inversion. The number of inversions determines the length of the delay. Alternatively, voltage sensors which sense the voltages on gate 25 and output terminal 18, for example, could be used to control the timing of the bootstrapping and the discharge of the gate 25.

Pass gate transistor 40 includes a gate which is coupled as shown to a drain of an n-channel transistor 68. A source of transistor 68 is coupled to node 70. A drain of n-channel transistor 72 also is coupled to node 70 as is a source of n-channel transistor 74.

The gate of transistor 72 is coupled to the gate 25 of transistor 24, and the source of transistor 72 is coupled to the ground potential. The gate of transistor 68 is coupled to the 5 volt external voltage supply as is the drain of transistor 74. The gate of transistor 74 is coupled, via inverter 78, to be responsive to precharge control signal $\phi_p$.

Figure 3:
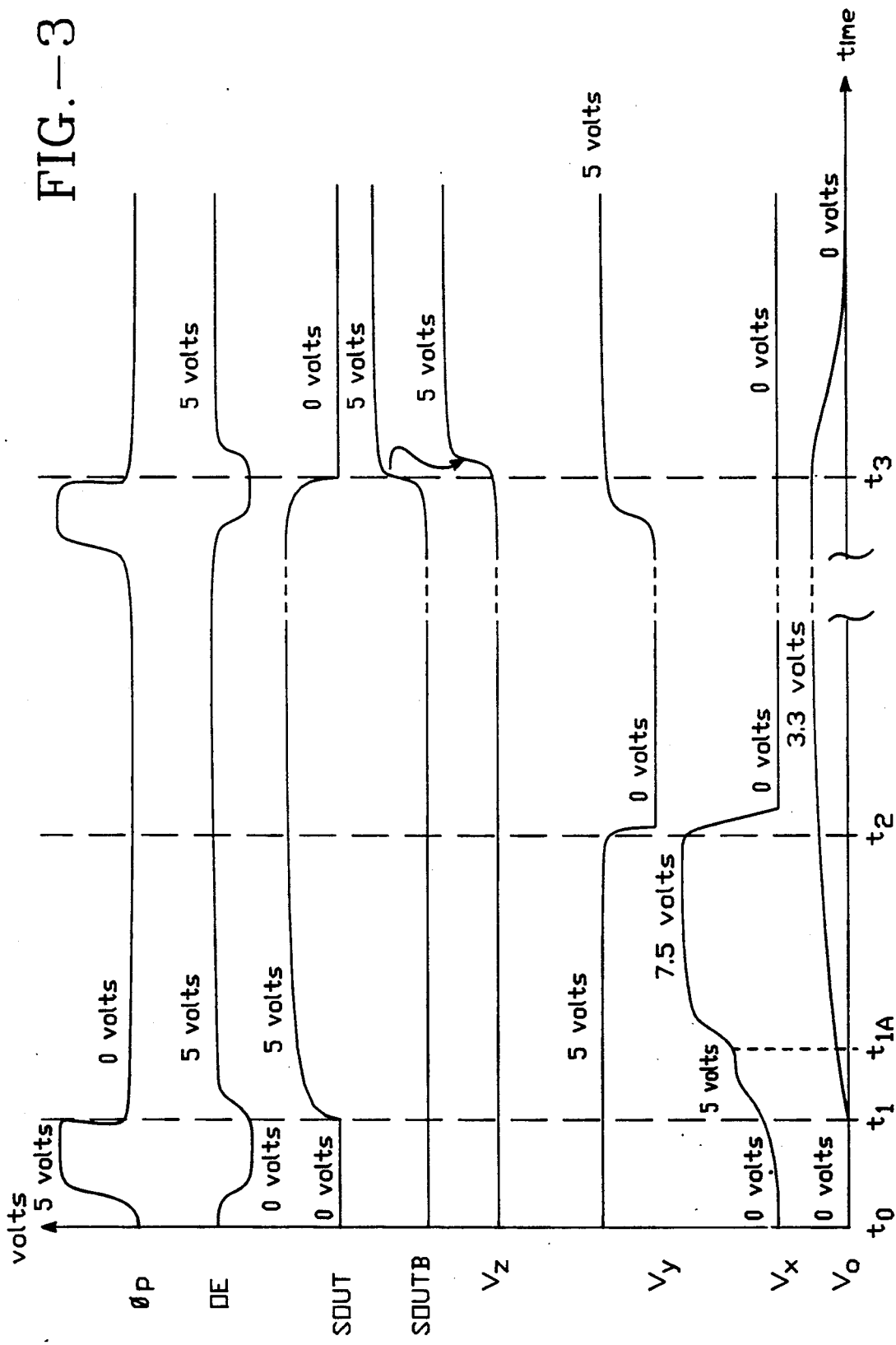
FIG. 3 is a timing diagram illustrating the operation of the embodiment of FIG. 2.

The operation of the output buffer circuit 12 will be explained with respect to illustrative the timing diagram of FIG. 3. In FIG. 3, the voltage at the gate of transistor 24 is indicated as $V_x$. The voltage at the gate of transistor 22 is indicated as $V_y$. The voltage at the gate of transistor 26 is indicated as $V_z$.

Upon an occurrence of a read of digital information from the core memory array 14, a precharge signal $\phi_p$ is provided to gate 78. In response to the precharge signal, the pass gate transistor 40 couples inverter 32 to the gate 25 of transistor 24. When the read involves a low to high output signal transition, the respective voltage $V_y$ on the gate of pull-up transistor 24 initially is 0 volts indicated between $t_0$ and $t_1$, and the voltage $V_y$ on the gate of transistor 22 initially is 5 volts. Upon the transition of the internal output signal SOUT from 0 volts to 5 volts at $t_1$, an internal 5 volt signal is provided both to the inverting delay circuit 38 and to the gate 25 of transistor 24. At time $t_{1A}$, the gate 25 voltage is approximately 5 volts, and transistor 24 turns on.

In response, the bootstrapping circuit 42 provides a bootstrapped voltage pulse to the gate 25. The level of the voltage pulse, approximately 7.5 volts, is greater than the 5 volt external voltage supply. More particularly, at $t_{1A}$, after a delay caused by delay circuit 56, capacitor 44 begins to charge so as to cause the voltage $V_x$ on the gate 25 to rise to approximately 7.5 volts. The rise from 0 volts to approximately 7.5 volts occurs during a first time interval, indicated in the timing diagram between times $t_1$ and $t_2$. In the presently preferred embodiment, the voltage $V_x$ at gate 25 reaches 5 volts at $t_{1A}$, approximately 1 ns after $t_1$. Approximately 2 ns later, $V_x$ reaches approximately 7.5 volts. Then, approximately 1.5-2.0 ns later, $V_x$ returns to 0 volts as the bootstrapping pulse is turned off.

Both the p-channel pull-up transistor 22 and the n-channel pull-down transistor 26 are cut off between $t_1$ and $t_2$. During this first time interval, the n-channel transistor 24 pulls up the voltage at the output terminal 18 to approximately 3.3 volts. Thus, during the transition of the output voltage at terminal 18 from 0 volts to 3.3 volts, the n-channel pull-up transistor provides the drive. The p-channel pull-up transistor 22 is cut off, and the on-chip lower level 3.3 volt supply does not drive any external load (not shown).

The first and second timing and control circuits 48, 50 cooperate to apply to the gate terminal of turn-off transistor 46 a turn-on voltage upon the passage of the first time interval. Control circuit 48 senses $V_x$ applied to gate 25 going high. Bootstrap occurs because circuit 48 drives node 51 low at time $t_{1A}$. Control circuit 50 senses the low signal at node 51, and after a second delay, turns on the turn-off transistor 46. The second delay which is caused by cooperation of delay circuits 62, 66 is long enough for the output voltage $V_o$ to reach approximately 3.3 volts. Upon turn on of the turn-off transistor 46 at time $t_2$, the voltage $V_x$ applied to the gate 25 of transistor 24 is discharged to the ground potential and the n-channel transistor 24 is quickly turned off.

Moreover, after a prescribed delay, the output of NAND gate 54 changes from logical zero to a logical one, and the capacitor 44 ceases charging. It will be appreciated that capacitor 44 ceases charging before the turn-off of transistor 46. If capacitor 44 is still charged upon turn on of transistor 46, however, then transistor 46 must sink enough charge to change $V_x$ on gate 25 from 7.5 volts to 0 volts. If, on the other hand, capacitor 44 is no longer charged when transistor 46 is turned on, then transistor 46 must sink only enough charge to change $V_x$ from 5 volts to 0 volts.

During the low to high transition, as the capacitor 44 charges gate 25, the gate of transistor 72 also is charged. As a result, transistor 72 turns on which, in turn, causes the pass gate transistor 40 to turn off thereby disconnecting the gate 25 of transistor 24 from the output of inverter 32. As the gate of transistor 24 is discharged through transistor 46, the pass gate transistor 40 remains turned off. In fact, the pass gate transistor 40 remains turned off until another control signal $\phi_p$ is received by control gate 78.

The inverting delay circuit 38 is constructed such that in response to an output signal provided by inverter 32, an inverted version of the output signal is provided to the gate of the p-channel pull-up transistor 22 after passage of the first time interval. The delay caused by inverting delay circuit 38 is chosen to be long enough such that the n-channel pull-up transistor 24 and the p-channel pull-up transistor 22 ordinarily are not turned on at the same time so as to avoid using the 3.3 volt source to drive output loads. Upon provision of the inverted version of the output signal at the gate of transistor 22, the p-channel pull-up transistor 22 turns on. Thus, the p-channel transistor provides a sustaining 3.3 volt drive to the output terminal which clamps the output terminal to the 3.3 volt level. The n-channel pull-down transistor 26 is cut off throughout the transition period, $t_1$ to $t_2$ and during the sustaining period after $t_2$.

It will be appreciated that, since the p-channel device is not turned on until the output voltage has substantially reached the 3.3 volt level, the on-chip 3.3 volt supply need not actually drive an external load. Rather, it merely sustains the 3.3 volt level.

In the presently preferred embodiment, the inverting delay circuits 56, 62, 66 are constructed such that, in the course of a low to high output transition, the first time interval is sufficiently long for the n-channel transistor 24 to pull up the voltage level at the output terminal 18 to approximately 3.3 volts, but no more. Moreover, the inverting delay circuit 38 causes a delay which is sufficiently long such that the p-channel transistor 22 is not turned on until the output voltage has substantially reached 3.3 volts.

The use of an n-channel pull-up transistor 24 advantageously reduces the chance that a voltage at the output terminal 18 will greatly overshoot the 3.3 volt upper limit. The body effect typical of n-channel devices will tend to turn-off transistor 24 before it can significantly overshoot the 3.3 volt level. Furthermore, in the event that the output voltage does overshoot the 3.3 volt level, the p-channel transistor 22, when it turns on, will pull the output voltage back to the desired 3.3 volt level.

Referring once again to the timing diagram of FIG. 3, a transition from a high to a low voltage level is indicated by the signals occurring after time $t_3$. Another control signal $\phi_p$ is provided. Internal output signals SOUT and SOUTB are provided as shown. In response, the voltage $V_x$ at the gate 25 of transistor 24 remains at 0 volts. The voltage $V_z$ at the gate of transistor 22 remains at 0 volts, and the voltage at the gate of transistor 26 becomes 5 volts. Consequently, transistors 22 and 24 are cutoff and transistor 26 is turned on. The result is an output voltage level $V_0$ of approximately 0 volts at the output terminal 18.

Delay circuit 38 can be constructed such that the path to turn-off transistor 22 is faster than the path to turn-on transistor 22. In this manner, transistor 22 can be prevented from fighting against transistor 26 during high-to-low output signal transitions.

Additional alternative embodiments of the invention can be practiced without departing from the spirit and scope of the invention. For example, an n-channel transistor coupled to a 3.3 volt power supply or both an n-channel and a p-channel transistor coupled to a 3.3 volt power supply could be substituted for the second p-channel pull-up transistor 22. Thus, the foregoing description is not intended to limit the invention which is defined in the appended claims in which:

What is claimed is:

1. A bootstrapping output buffer circuit for use with a first external voltage source providing voltage at a first voltage level, comprising:
   an output terminal;
   a second voltage supply for providing voltage at a second voltage level less than the first voltage level;
   first n-channel pull-up transistor means including a drain operatively coupled to the first voltage supply and including a source operatively coupled to the output terminal;
   second pull-up transistor means including a first terminal operatively coupled to the output terminal and including a second terminal operatively coupled to the second voltage supply;
   n-channel pull-down transistor means including a drain operatively coupled to the output terminal;
   first turn-on means for turning on said first n-channel pull-up transistor means;
   bootstrapping means for bootstrapping a gate of said first n-channel pull-up transistor means to a bootstrapped voltage level above the first voltage level;
   turn-off means for turning off said first n-channel pull-up transistor means when said output terminal has been substantially pulled up to the second voltage level; and
   second turn-on means for turning on said second pull-up transistor means when said output terminal has been substantially pulled up to the second voltage level.

2. The circuit of claim 1 wherein said second pull-up transistor means includes a p-channel transistor.

3. The circuit of claim 1,
   wherein said second pull-up transistor means includes p-channel transistor means;
   wherein said first terminal is a source of said p-channel transistor means; and
   wherein said second terminal is a drain of said p-channel transistor means.

4. The circuit of claim 1 wherein said turn-off means operatively couples the gate of said first n-channel pull-up transistor means to a ground potential when said output terminal has been substantially pulled up to the second voltage level.

5. The circuit of claim 1 wherein said turn-off means includes transistor means including a first terminal operatively coupled to a gate of said first n-channel pull-up transistor means and including a second terminal operatively coupled to a ground potential.

6. The circuit of claim 1 wherein said turn-off means includes an n-channel turn-off transistor with a drain operatively coupled to the gate of said first pull-up transistor means and a source operatively coupled to ground potential.

7. The circuit of claim 1 wherein said bootstrapping means includes capacitive means operatively coupled to the gate of said first n-channel pull-up transistor means.

8. The circuit of claim 1 and further including:
   timing means for indicating passage of a first time interval during which said output terminal transitions substantially from ground potential to the second voltage level; and
   wherein said turn-off means turns off said first transistor means in response to an indication by said timing means that the first time interval has substantially passed.

9. The circuit of claim 1 wherein said second turn-on means includes timing means for delaying a turn on of said second pull-up transistor means.

10. The circuit of claim 1 wherein said bootstrapping means provides a bootstrapped voltage pulse to the gate of said first n-channel pull-up transistor means.

11. The circuit of claim 10 wherein said bootstrapping means includes timing means for delaying bootstrapping until said first transistor means has been turned on.

12. The circuit of claim 1 and further including:
   internal output means for providing an internal output signal; and
   wherein said first turn-on means includes coupling means for coupling said internal output means to a gate of said first transistor means upon initial provision of an internal output signal by said internal output means and for uncoupling said internal output means from the gate of said first transistor means when a gate of said first n-channel pull-up transistor means substantially reaches the first voltage level.

13. The circuit of claim 12 wherein said coupling means includes:
   pass gate means operatively connected between the internal output means and said bootstrapping the gate of said first transistor means.

14. The circuit of claim 1 and further including:
   internal output means for providing an internal output signal;
   wherein said first turn-on means includes pass gate means operatively connected between said internal output means and a gate of said first transistor means;
   first control means for causing said pass gate means to couple said internal output means to the gate of said first transistor means while a gate of said first n-channel pull-up transistor means transitions from ground potential substantially to the first voltage level; and second control means for causing said pass gate means to uncouple said internal output means from the gate of said first n-channel pull-up transistor means when the gate of said first n-channel transistor means substantially reaches the first voltage level.

15. The circuit of claim 14 wherein said pass gate means includes a field effect transistor.

16. The circuit of claim 14 wherein said second control means includes transistor means including a terminal operatively coupled to the ground potential.

17. A bootstrapping output buffer circuit for use with a first external voltage source providing voltage at a first voltage level, comprising:
an output terminal;
a second voltage supply for providing voltage at a second voltage level less than the first voltage level;
n-channel pull-up transistor means including a drain operatively coupled to the first voltage supply and including a source operatively coupled to the output terminal;
p-channel pull-up transistor means including a drain operatively coupled to the output terminal and a source operative coupled to said second voltage supply;
n-channel pull-down transistor means including a drain operatively coupled to the output terminal;
first transistor turn-on means for turning on said n-channel pull-up transistor;
bootstrapping means for bootstrapping a gate of said n-channel pull-up transistor means to a bootstrapped voltage level above the first voltage level;
bootstrap turn-on means for turning on said bootstrapping means after said n-channel pull-up transistor means has been turned on by said first transistor turn-on means;
turn-off means for turning off said n-channel pull-up transistor means when said output terminal has been substantially pulled up to the second voltage level; and
second transistor turn-on means for turning on said p-channel pull-up transistor means when the output voltage at said output terminal has been substantially pulled up to the second voltage level.

18. The circuit of claim 17 wherein said first turn-on means includes n-channel transistor means.

19. The circuit of claim 17 wherein said bootstrapping means includes capacitor means operatively coupled to the gate of said n-channel pull-up transistor means.

20. The circuit of claim 17 or 19 wherein said bootstrap turn-on means includes:
timing means, responsive to said first turn-on means, for delaying turn on of said bootstrapping means for a time interval sufficient for said n-channel pull-up transistor means to turn on.

21. The circuit of claim 17 wherein said turn-off means includes turn-off transistor means which includes a first terminal operatively coupled to the gate of said n-channel pull-up transistor and a second terminal operatively coupled to a ground potential.

22. The circuit of claim 17 wherein said turn-off means includes:
turn-off transistor means which includes a first terminal operatively coupled to the gate of said n-channel pull-up transistor and a second terminal operatively coupled to ground potential; and
timing means for delaying turn on of said turn-off transistor means until said output terminal substantially reaches the second voltage level.

23. The circuit of claim 17,
wherein said bootstrapping means includes capacitor means operatively coupled to the gate of said n-channel pull-up transistor means;
wherein said bootstrapping means further includes timing means, responsive to said first turn-on means, for delaying turn on of said bootstrapping means for a time interval sufficient for said n-channel pull-up transistor means to turn on;
wherein said turn-off means includes turn-off transistor means including a first terminal operatively coupled to the gate of said n-channel pull-up transistor means and a second terminal operatively coupled to ground potential;
wherein said turn-off means further includes timing means for delaying turn on of said turn-off transistor means until said output terminal substantially reaches the second voltage level.

24. A method for controlling low-to-high transitions of an output voltage provided by an output terminal of an integrated circuit, wherein the output terminal is operatively coupled to the source of an n-channel pull-up transistor means and operatively coupled to a source of an n-channel pull-down transistor means:
providing a first voltage at a first voltage level;
applying the first voltage to a drain of the n-channel pull-up transistor means;
providing a second voltage at a second voltage level less than the first voltage level;
applying the second voltage to a first terminal of second pull-up transistor means wherein the second pull-up transistor means includes a second terminal operatively coupled to the output terminal;
turning on the n-channel pull-up transistor means;
bootstrapping a gate of the n-channel pull-up transistor means to a bootstrapped voltage level above the first voltage level;
turning off the n-channel pull-up transistor means when the output terminal has been substantially pulled up to the second voltage level; and
turning on the second pull-up transistor means, when the output terminal has been substantially pulled up to the second voltage level.

25. The method of claim 24 wherein said step of providing the second voltage includes generating the second voltage on the integrated circuit which contains the output terminal.

26. The method of claim 24 wherein said step of turning on the n-channel pull-up transistor includes providing a voltage at the first voltage level to the gate of the first n-channel pull-up transistor means.

27. The method of claim 24 wherein said step of bootstrapping includes charging a capacitor operatively coupled to a gate of the n-channel pull-up transistor means.

28. The method of claim 24 wherein said step of turning off includes operatively coupling a gate of the n-channel pull-up transistor to a ground potential.

29. The method of claim 24 and further including the step of:
delaying said step of turning off for a time interval sufficient for the output voltage to substantially reach the second voltage level.

30. The method of claim 24 or 29 and further including the step of:
delaying said step of turning on the second pull-up transistor means for a time interval sufficient for the output voltage to substantially reach the second voltage level.

* * * * *